(12) United States Patent
Masuda et al.

(10) Patent No.: US 6,873,518 B2
(45) Date of Patent: Mar. 29, 2005

(54) SHIELDED STRIP LINE DEVICE AND METHOD OF MANUFACTURE THEREOF

(75) Inventors: Koichiro Masuda, Tokyo (JP); Hirokazu Tohya, Tokyo (JP); Masaharu Satoh, Tokyo (JP)

(73) Assignee: NEC Corporation, Tokyo (JP)

( * ) Notice: Subject to any disclaimer, the term of this patent is extended or adjusted under 35 U.S.C. 154(b) by 150 days.

(21) Appl. No.: 10/701,587

(22) Filed: Nov. 5, 2003

(65) Prior Publication Data

US 2004/0105218 A1 Jun. 3, 2004

Related U.S. Application Data

(63) Continuation of application No. 10/247,976, filed on Sep. 20, 2002, now Pat. No. 6,721,171.

(30) Foreign Application Priority Data

Sep. 20, 2001 (JP) .................................... 2001-287463
Oct. 9, 2001 (JP) .................................... 2001-311529

(51) Int. Cl.$^7$ ............................................. H01G 9/02
(52) U.S. Cl. .................. 361/525; 361/516; 361/517; 361/523; 361/528; 361/529; 29/25.03
(58) Field of Search ...................... 361/525, 516, 361/517, 508, 509, 523, 528, 529, 530, 532, 534, 540, 541; 29/25.03

(56) References Cited

U.S. PATENT DOCUMENTS

| 3,611,051 A | | 10/1971 | Puppolo et al. | |
| 5,455,736 A | | 10/1995 | Nishiyama et al. | |
| 5,978,231 A | * | 11/1999 | Tohya et al. | 361/782 |
| 6,046,898 A | * | 4/2000 | Seymour et al. | 361/113 |
| 6,185,091 B1 | | 2/2001 | Tanahashi et al. | |
| 6,388,863 B1 | * | 5/2002 | Horie | 361/303 |
| 6,473,293 B2 | * | 10/2002 | Shimada et al. | 361/523 |
| 6,587,327 B1 | * | 7/2003 | Devoe et al. | 361/306.3 |
| 6,590,762 B2 | * | 7/2003 | Greenwood et al. | 361/523 |

FOREIGN PATENT DOCUMENTS

| JP | 58-130601 | 8/1983 |
| JP | 03-035516 | 2/1991 |
| JP | H4-56445 | 9/1992 |
| JP | 05-041337 | 2/1993 |
| JP | 06-053046 | 2/1994 |
| JP | 2001-068381 | 3/2001 |

\* cited by examiner

*Primary Examiner*—Anthony Dinkins
*Assistant Examiner*—Nguyen T. Ha
(74) *Attorney, Agent, or Firm*—Katten Muchin; Zavis Rosenman

(57) ABSTRACT

A dielectric oxide film is formed on the surface of a valve metal plate formed of aluminum and a conductive polymer layer is provided so as to cover the valve metal plate and the dielectric oxide film. The conductive polymer layer is formed of polyaniline having para-toluenesulfonic acid as a dopant. A conductive carbon paste layer and a silver paste layer are provided at the outer side of the conductive polymer layer and a metal plate, comprising a copper foil, is overlapped onto the silver paste layer. Anode lead terminals are connected to the ends of the valve metal plate and the respective end parts of the metal plate are arranged as cathode lead terminals. A shield strip line device, which is low in impedance, especially in high-frequency ranges of 100 MHz or more, and is favorably adapted to high speed and high frequencies, mainly for use as a bypass device for a noise filter or as a decoupling device, is thus obtained.

10 Claims, 8 Drawing Sheets

SHIELDED STRIP LINE DEVICE AND METHOD OF MANUFACTURE THEREOF

CROSS-REFERENCE TO RELATED APPLICATION

This application is a continuation of application Ser. No. 10/247,976, filed on Sep. 20, 2002, now U.S. Pat. No. 6,721,171.

BACKGROUND OF THE INVENTION

1. Technical Field of the Invention

This invention relates to a shielded strip line device to be mounted on a circuit board or an electronic substrate and a method of manufacture thereof, and particularly relates to a shielded strip line device, which is favorably adapted to high speeds and high frequencies, mainly for use as a noise filter bypass device or power decoupling device, and a method of manufacturing such a shielded strip line device.

2. Description of the Related Art

With the progress of scientific technologies, the making of electronic equipment more compact and higher in performance is being demanded. This is achieved, for example in switching power supplies and digital signal processing circuit parts, by making the clock frequency higher. However, this causes an increase in the high frequency current that flows through the circuit, in particular the power supply circuit, causing significant increase in electromagnetic radiation and lowering of signal quality and thus placing more difficult demands on the performance of noise filter bypass devices and power decoupling devices.

As power decoupling devices for high-speed digital circuits, ceramic capacitors, formed by laminating a plurality of layers of ceramic material having a thin metal film deposited thereon, and solid-state electrolytic capacitors, having a porous formed body of a valve metal, such as tantalum or aluminum, etc., as an anode, the oxide film of this porous formed body as a dielectric, and a conductive polymer as a solid-state electrolyte, have been developed priorly.

As an example of a solid-state electrolytic capacitor, Japanese Patent Publication No. Hei-4-56445 (Japanese Unexamined Patent Publication No. Sho-60-37114) discloses a solid-state electrolytic capacitor having polypyrrole or an alkyl-substituted form thereof disposed as a solid-state electrolyte on a dielectric oxide film. Also, Japanese Unexamined Patent Publication No. Hei-3-35516 discloses a solid-state electrolytic capacitor, with which polyaniline is formed as a solid-state electrolyte on a dielectric oxide film, and a method of manufacturing such a solid-state electrolytic capacitor. With each of these capacitors, a conductive polymer that is 100 times or more higher in conductivity in comparison to prior capacitors is used as the solid-state electrolyte. These capacitors are thus small in equivalent serial resistance and, in comparison to prior capacitors of the same capacitance, exhibit effects up to a high frequency range that is 100 times or more higher in frequency. However, even these capacitors increase dramatically in impedance and cannot meet recent demands as filter bypass devices and power decoupling devices in high frequency ranges in the excess of 10 MHz.

Meanwhile, filter arrangements for accommodating high frequencies are also being examined. Japanese Unexamined Patent Publication No. Hei-6-53046 discloses a surface-mounted noise filter, comprising a meandering conductor and a ground conductor, each of which is sandwiched by ceramic dielectric sheets. FIG. 1 is a sectional view, which shows the arrangement of this prior-art surface-mounted filter. As shown in FIG. 1, with this prior-art surface-mounted filter, a first dielectric sheet 110, second dielectric sheet 120, and third dielectric sheet 130, which are, respectively, rectangular form, are laminated to form a laminated body 153. A first signal electrode 151 and a second signal electrode 152 are attached respectively to each of the pair of mutually opposing end faces among the end faces parallel to the direction of lamination of laminated body 153.

A first internal conductor 111, second internal conductor 112, and meandering conductor 115, which are used for signal transmission, are disposed between first dielectric sheet 110 and second dielectric sheet 120. First internal conductor 111 is connected to first signal electrode 151, second internal conductor 112 is connected to second signal electrode 152, and meandering conductor 115 is connected between first internal conductor 111 and second internal conductor 112. A ground conductor 125, which opposes meandering conductor 115, is disposed between second conductive sheet 120 and third conductive sheet 130, and ground conductor 125 is connected to a pair of ground electrodes (not shown). These ground electrodes are attached to a pair of end faces, among the end faces of laminated body 153 that are parallel to the direction of lamination of laminated body 153, to which first signal electrode 151 and second signal electrode 152 are not attached. An inductance is formed at meandering conductor 115 and a capacitance is formed across meandering conductor 115 and ground conductor 125. A noise filter, which combines an inductance device and a capacitance device, is thus formed and noise filter that is excellent in noise absorption characteristics at high frequencies is thus obtained. With this surface-mounted filter, an electric signal that is input from first signal electrode 151 is filtered by passage through first internal conductor 111, meandering conductor 115, and second internal conductor 112 and output from second signal electrode 152.

However, this prior art has the following problem. Though capacitors, having an abovementioned conductive polymer as a solid-state electrolyte, are used in various applications as capacitors that can be used up to a high-frequency range, even with such capacitors, the impedance increases drastically in a high-frequency range in the excess of 10 MHz. Thus under operation at a clock frequency of several hundred MHz, which is generally implemented in digital circuits, the characteristic assumed for a signal generating circuit, that is, the characteristic that the power impedance is infinitely close to zero regardless of frequency cannot be realized as long as such a capacitor is used. As a result, these capacitors cannot meet recent demands as filter bypass devices or power decoupling devices. Also, though surface-mounted filters for the purpose of noise elimination have also been developed, these cannot realize an infinitely low impedance value and are thus limited in use as substitutes for capacitors. It is thus difficult to realize low impedance especially in high-frequency regions of 100 MHz or more with such filters.

SUMMARY OF THE INVENTION

An object of this invention is to provide a shielded strip line device, which is low in impedance, especially in high-frequency regions of 100 MHz or more, and is favorably adapted to high speed and high frequencies, mainly for use as a bypass device for a noise filter or as a decoupling device.

A shielded strip line device according to the present invention comprises a metal member formed of a valve metal through which high-frequency current flows and with which the cross-sectional shape orthogonal to the direction in which the high-frequency current flows is practically constant in the current direction, a dielectric oxide film, formed on the surface of this valve metal member, and a conductive layer, provided so as to sandwich the dielectric oxide layer and surround the metal member.

With this invention, by making the metal member have a transmission line structure with which the cross-sectional shape orthogonal to the direction of current is constant or fixed, the electromagnetic field within the metal member is made uniform even when the current that flows inside the metal member is a high-frequency current and the frequency dependence of the characteristic impedance is thus made small. Also by forming the metal member from a valve metal, a dielectric oxide film can be formed on the surface of the metal member. A valve metal is a metal that forms a dielectric oxide film on its surface. Furthermore, by providing a conductive substance layer (conductive layer) so as to surround the metal member, a shielded strip line, which is a form of transmission line structure, is realized. A strip line is a structure having conductive layers disposed above and below a signal line and a shielded strip line is a structure with which these upper and lower-conductive layers are connected to each other at the sides of the signal line. The magnetic flux that leaks from the sides of the metal member that is the signal line can thereby be shielded, thus lowering the characteristic impedance of the device further. As a result, electric signals input into the metal member can be filtered by means of the dielectric oxide film and the conductive layer over a wide frequency range. A line device adapted for high speeds and high frequencies can thus be realized.

The abovementioned cross-sectional shape may be rectangular, circular, or annular. The absolute value of the characteristic impedance of the device also depends on the cross-sectional shape of the metal member. In a case where the abovementioned cross-sectional shape is rectangular, the shape of the abovementioned metal member will be a rectangular parallelepiped shape, such as a flat plate-like shape. In a case where the abovementioned cross-sectional shape is circular, the shape of the metal member will be columnar. In a case where the abovementioned cross-sectional shape is annular, the shape of the metal member will be cylindrical. The abovementioned cross-sectional shape only needs to be practically rectangular, circular, or annular.

The abovementioned valve metal preferably comprises one type or two or more types of metal selected from the group consisting of aluminum, aluminum alloys, tantalum, tantalum alloys, niobium, and niobium alloys. A uniform and stable dielectric oxide film that is high in dielectric constant can then be formed by oxidizing the surface of the metal. As a result, a stable shielded strip line device of excellent volumetric efficiency can be obtained readily.

Furthermore, the abovementioned conductor layer preferably comprises a conductive polymer. A conductor layer of high conductivity that closely contacts the dielectric layer formed on the surface of the metal member can then be formed even when the surface of the metal member is expanded by etching, etc. A shielded strip line device that can be used up to a high frequency range can thus be obtained readily.

In particular, the abovementioned conductive polymer preferably comprises one type or two or more types of substance selected from the group consisting of polypyrrole, polythiophene, and polyaniline. A conductor layer that is excellent in environmental stability and is stable to a temperature of at least 100° C. can then be formed. As a result, a shielded strip line device that is excellent in stability and durability and can be used up to a high frequency range can thus be obtained readily.

THE PREFERRED EMBODIMENTS OF THE INVENTION

Figure 1:
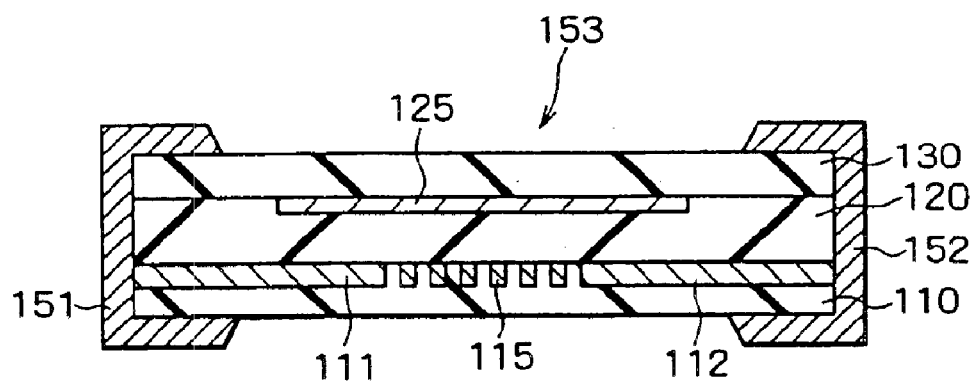
FIG. 1 is a sectional view, showing an example of a prior-art, surface-mounted filter.
Figure 2:
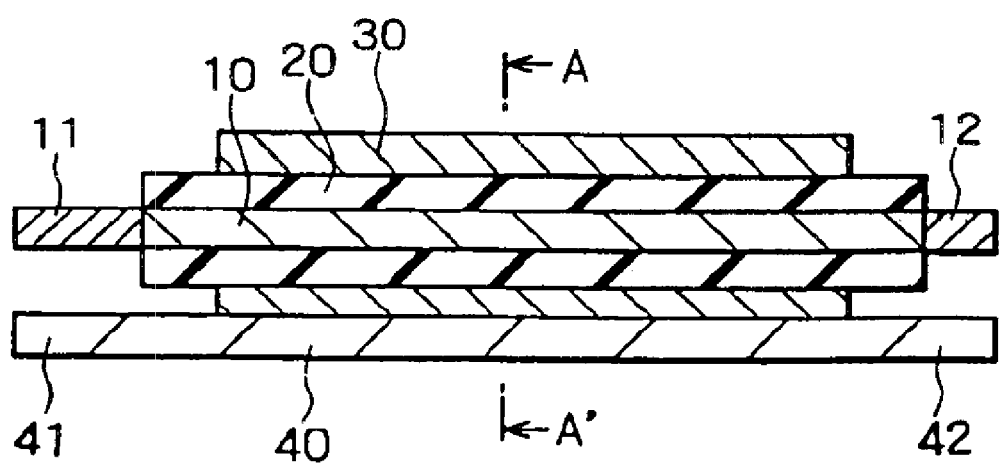
FIG. 2 is a sectional view, showing a shielded strip line device according to an embodiment of this invention.

Embodiments of the present invention shall now be described with reference to the attached drawings. First, a first embodiment of the present invention shall be described. FIG. 2 is a sectional view, showing a shielded strip line device of the embodiment, and FIG. 3 is a sectional view, showing the section along line A–A' of FIG. 2.

Figure 3:
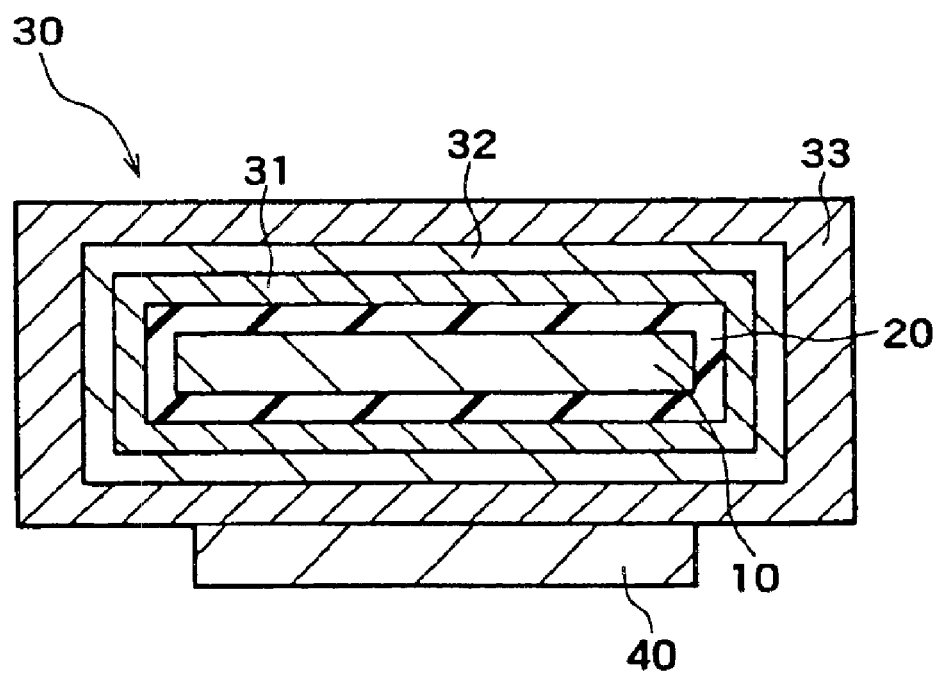
FIG. 3 is a sectional view along line A–A' of FIG. 2.

As shown in FIGS. 2 and 3, with the shielded strip line device of the present embodiment, a metal plate 10, which comprises a valve metal and is substantially of a planar shape, is provided. Valve metal plate 10 is formed, for example, of aluminum. Valve metal plate 10 is rectangular in shape and, for example, 110 μm in thickness, 20 mm in length, and 10 mm in width. The surface of valve metal plate 10, that is, the top face, rear face, and end faces are increased by approximately 200 times in surface area by electrolytic etching in an electrolytic solution.

A dielectric oxide film 20 is formed on the surface of this valve metal plate 10. Dielectric oxide film 20 is formed by oxidizing the surface of valve metal plate 10. Also, a conductive polymer layer 31 is formed on dielectric oxide film 20 so as to cover valve metal plate 10 and dielectric oxide film 20. With the present embodiment, conductive polymer layer 31 is formed of polyaniline having para-toluenesulfonic acid as a dopant. At both ends of valve metal plate 10 in the length direction, conductive polymer layer 31 is not formed and dielectric oxide film 20 is exposed. The length of each of these exposed parts in the length direction of valve metal plate 10 is, for example, 5 mm. Anode lead terminals 11 and 12 are connected respectively to these exposed parts. Anode lead terminals 11 and 12 are for making an electric signal flow through valve metal plate 10, and anode lead terminals 11 and 12 must thus be separated to some degree from each other. A conductive carbon paste layer 32 is formed on conductive polymer layer 31 and a silver paste layer 33 is formed on conductive carbon paste layer 32. A conductive layer 30 is formed by conductive polymer layer 31, conductive carbon paste layer 32, and silver paste layer 33. That is, dielectric oxide film 20 is formed so as to cover valve metal plate 10 and conductive layer 30 is formed so as to cover regions of dielectric oxide film 20 besides the abovementioned exposed parts. A metal plate 40, comprising a copper foil with a thickness, for example, of approximately 100 $\mu$m, is overlapped onto the surface at one side of conductive layer 30. Metal plate 40 is disposed so that its surface is parallel to the surface of valve metal plate 10. The length in the longitudinal direction of metal plate 40 is longer than the length in the longitudinal direction of conductive layer 30 and the respective end parts of metal plate 40 are thus not overlapped by conductive layer 30. These end parts are arranged respectively as cathode lead terminals 41 and 42.

Since the two or more anode lead terminals 11 and 12 that are provided at different positions of valve metal plate 10 are for inputting an electric signal into valve metal plate 10 that is covered by a dielectric oxide film, it is practical for these terminals to be separated by some distance. With the present invention, the valve metal may, for example, be protruded at both sides and these protruded parts may be arranged as anode lead terminals or terminals attached by welding or crimping may be used as anode lead terminals.

Valve metal plate 10 is not restricted to aluminum as in the present embodiment and any of various metals may be used as long as it is a valve metal. Examples of such a valve metal include aluminum, aluminum alloys, tantalum, tantalum alloys, niobium, niobium alloys, titanium, titanium alloys, zirconium, zirconium alloys, silicon, magnesium, magnesium alloys, etc. A metal selected from the group consisting of tantalum, aluminum, and niobium is especially preferable as a valve metal. Valve metal plate 10 may be a rolled foil, a sintered compact of fine powder, etc. Furthermore, the shape of valve metal plate 10 may be a curved shape or a partially bent shape. The method of forming a dielectric oxide film on the surface of the valve metal also is not restricted in particular and may be formed by electrolytic formation using an electrolytic solution, formed using a suitable oxidizing agent, or an oxide film formed by air oxidation may be used as it is as the dielectric oxide film for this invention. However normally, the dielectric oxide film is formed by electrolytic formation.

Though the shape of the valve metal is also not restricted in particular and is preferably a flat, plate-like shape (with which the cross-sectional shape orthogonal to the longitudinal direction of the valve metal is rectangular) from the standpoint of calculation of the characteristic impedance and processing, the valve metal that is curved or partially bent may also be used. The valve metal may also have a columnar shape or cylindrical shape. With this invention, a valve metal that has been expanded in surface may be used. Examples of a valve metal that has been expanded in surface include a valve metal formed by processing a sintered compact of fine powder into a flat, plate-like shape, an etched foil formed by electrolytic etching in an electrolytic solution, etc.

Also though with the present embodiment, an example, wherein conductive layer 30 is formed of conductive polymer layer 31, comprising polyaniline, conductive carbon paste 32, and silver paste 33, was indicated, the conductive layer is not restricted in particular as long as it is conductive and may be formed of any of various metals, a semiconductor, such as manganese dioxide, indium oxide, etc., or an organic dielectric, such as a charge transfer complex of tetracyanoquinodimethane and tetrathiafulvalene. A conductive polymer, such as polypyrrole, polythiophene, polyethylenedioxythiophene, polyaniline, polyphenylene, polyfuran, polythiazyl, polyphenylenevinylene, polyacetylene, polyazulene, etc., is especially preferable, and among these, polypyrrole, polythiophene, polyaniline, and derivatives thereof are preferable from standpoint of stability. With the present invention, derivatives of polypyrrole, polythiophene, and polyaniline shall refer, for example, to substances with which various substituents are added to the abovementioned compounds, substances with which the abovementioned compound is copolymerized with another polymer, etc. Also with this invention, a conductive polymer is normally used in combination with a dopant that comprises a compound with an electron donating property or electron withdrawing property. With this invention, the type of dopant is not restricted in particular, and for example, a dopant comprising a conductive polymer or a known dopant may be used. Examples of such a dopant include compounds halogenated by iodine, chlorine, perchlorate anion, etc., substances that act as Lewis acids, such as aromatic sulfonic acid compounds, and substances that act as Lewis bases, such as lithium, tetraethylammonium cation, etc.

Though with this invention, conductive layer 30 is preferably arranged from a conductive polymer as was mentioned above, a conductive polymer may be used as a layer in contact with dielectric oxide film 20 and a layer comprising another type of conductive polymer may be formed on the abovementioned conductive polymer layer. Furthermore, the solid electrolyte of the conductive substance and the metal plate may be put in contact as they are or may be connected using a conductive carbon paste or silver paste. With the illustrated example, conductive layer 30 has a three-layer structure of conductive polymer layer 31, which contacts dielectric oxide film 20, conductive carbon paste 32, disposed on conductive polymer layer 31, and silver paste 33, disposed on conductive carbon paste 32, and is arranged so that metal plate 40 can be attached by means of conductive carbon paste 32 and silver paste 33.

Furthermore, though with the present embodiment, an example wherein a metal plate 40, comprising a copper foil with a thickness, for example, of approximately 100 $\mu$m, is overlapped onto the surface at one side of conductive layer 30, was indicated, the material of metal plate 40 is not restricted to copper and it is sufficient that it be a metal of low electrical resistance, such as silver, gold, aluminum, etc. Further lowering of impedance can be realized by means of this metal plate 40. Also, two metal plates 40 may be disposed in an opposing manner at both faces of valve metal plate 10.

Furthermore, though with the present embodiment, an example, wherein conductive polymer layer 31 and metal plate 40 are connected to each other via conductive carbon paste layer 32 and silver paste layer 33, was indicated, conductive carbon paste layer 32 and silver paste layer 33 may be omitted and conductive polymer layer 31 may be connected directly to metal plate 40.

The shielded strip line device of this embodiment may be mounted as it is on an electronic circuit board or may be used upon drawing out lead terminals and sealing in resin or a metal case, etc.

The shielded strip line device of the present invention may be mounted as it is on a wiring board or electronic circuit board or may be used upon drawing out lead terminals and sealing in resin or a metal case, etc.

A method of manufacturing the shielded strip line device of the present embodiment shall now be described. First, as valve metal plate 10, an aluminum foil, with a thickness, for example, of 110 μm, a length, for example, of 20 mm, and a width, for example, of 10 mm is prepared. Next, the surface area of valve metal plate 10 is expanded by approximately 200 times by electrolytic etching in an electrolytic solution. Valve metal plate 10 is immersed, for example, in an aqueous ammonium borate solution with a concentration of 5% by mass, subject to anodic oxidation by application of a voltage, for example, of 10V, and then washed and dried to form dielectric oxide film 20, comprising a metal oxide film, on the surface of valve metal plate 10. The respective ends in the longitudinal direction, that is, regions within 5 mm from the respective edges of valve metal plate 10, on which dielectric oxide film 20 has been formed, are then immersed in a solution of fluororesin, comprising hexafluoropropylene, and then dried to form masks comprising hexafluoropropylene (not shown) at the abovementioned ends. When the electrostatic capacitance of such a valve metal plate 10 is measured upon immersion in a 0.1N aqueous sulfuric acid solution, the electrostatic capacitance is found to be approximately 380 μF.

An aqueous solution, containing, for example, 10% by mass of para-toluenesulfonic acid and, for example, 5% by mass of aniline, is then prepared in a glass container, and the valve metal plate 10, on which the above-mentioned dielectric oxide film 20 and masks have been formed, is immersed in and then taken out from this aqueous solution. The valve metal plate is thereafter dried, for example, for 30 minutes in air at room temperature. An aqueous solution, containing, for example, 10% by mass of ammonium peroxodisulfate and 10% by mass of para-toluenesulfonic acid, is then prepared, and valve metal plate 10 is immersed in and then taken out from this aqueous solution and then left in air for another 20 minutes to polymerize the aniline. Thereafter, this valve metal plate 10 is washed with water and ethanol and dried in an atmosphere of a temperature of 80° C. The operations from the immersion in the abovementioned aqueous solution of para-toluenesulfonic acid and aniline to the drying at a temperature of 80° C. are repeated four times to form conductive polymer layer 31, comprising polyaniline having para-toluenesulfonic acid as a dopant, on regions of the surface of dielectric oxide film 20 that are not covered by the abovementioned masks.

Conductive carbon paste layer 32 and silver paste layer 33 are then formed so as to cover the regions of the surface of valve metal plate 10 on which conductive polymer layer 31 has been formed. Conductive layer 30, comprising conductive polymer layer 31, conductive carbon paste layer 32, and silver paste layer 33, is thus formed. Thereafter, metal plate 40, comprising a copper foil with a thickness, for example, of approximately 100 μm, is overlapped onto the surface at one side of conductive layer 30. Metal plate 40 is thereby disposed so as to oppose one face of valve action metal plate 10 via conductive layer 30 and dielectric oxide film 20. The length in the longitudinal direction of metal plate 40 is longer than the length in the longitudinal direction of conductive layer 30 and the respective end parts in the longitudinal direction of metal plate 40 do not overlap with but protrude from conductive layer 30. These protruding end parts of metal plate 40 are used respectively as cathode lead terminals 41 and 42. Thereafter, the respective end parts of valve metal plate 10 are immersed in tetrahydrofuran to dissolve and eliminate the hexafluoropropylene, which is the resin that makes up the masks. An ultrasonic welder is then used to connect two anode lead terminals 11 and 12 to the respective ends of valve metal plate 10. The shielded strip line device of this embodiment is thus manufactured.

Though with the present embodiment, an example was indicated wherein electrolytic etching in an electrolytic solution is performed as a method of expanding the surface area of valve metal plate 10, a metal plate of expanded surface area may also be manufactured by processing a sintered compact of fine powder into a flat, plate-like shape.

The method of forming dielectric oxide film 20 is also not restricted in particular and may be formed by subjecting the surface of valve metal plate 10 to electrolytic formation in an electrolytic solution or by oxidation treatment using a suitable oxidizing agent, or an oxide film formed by air oxidation of the surface of valve metal plate 10 may be used as it is. However normally, dielectric oxide film 20 is formed by subjecting the surface of valve metal plate 10 to electrolytic formation.

Furthermore, though with this embodiment, anode lead terminals 11 and 12 are joined to valve metal plate 10 by ultrasonic welding, this joining may be performed by crimping or other method. Also, valve metal plate. 10 may be protruded at both sides and the respective end parts of valve metal plate 10 may be used as the anode lead terminals.

Furthermore, though with this embodiment, an example was indicated wherein conductive polymer layer 31 is formed by immersing valve metal plate 10 in an aqueous solution and then drying to polymerize aniline, the method of forming the conductive polymer layer in this invention is not restricted thereto, and conductive polymer layer 31 may be formed by a method wherein a conductive polymer solution is coated onto valve metal plate 10 and then the solvent in this solution is evaporated, a method wherein a monomer and/or oligomer that forms a conductive polymer and a polymerization catalyst are introduced and polymerization of the conductive polymer is then performed directly on valve metal plate 10, or a method wherein a layer of a polymer, which comprises an intermediate of a conductive polymer, is formed and converted to a conductive polymer.

With the shielded strip line device of this embodiment, a high-frequency signal current that is input from anode lead terminal 11 passes through valve metal plate 10 and is output from anode lead terminal 12. In this process, the abovementioned signal current can be filtered by the dielectric oxide film 20 and conductive layer 30. Since valve metal plate 10 has the shape of a transmission line structure and the shape of the cross section orthogonal to the direction of flow of signal current is substantially constant or fixed, the electromagnetic field inside valve metal plate 10 will be uniform even when the signal current is a high-frequency current and the frequency dependence of the characteristic impedance will thus be small.

Also, since valve metal plate 10 is formed of aluminum, a uniform and stable dielectric oxide film 20 can be formed readily on the surface of valve metal plate 10. Furthermore, since conductive layer 30 is provided so as to surround the periphery of valve metal plate 10, a shielded strip line is realized with which the magnetic flux that leaks from valve metal plate 10 can be shielded and the impedance of the device can be made low. Furthermore, by the provision of metal plate 40, cathode lead terminals 41 and 42 can be formed and the impedance of the device can be made even lower. Yet furthermore, since conductive layer 30 is provided with conductive polymer layer 31, a conductive layer that is well adhered to dielectric oxide film 20 and high in conductivity can be formed readily.

When the capacitance of the shielded strip line device of the present embodiment is measured using valve metal plate 10 as the anode and metal plate 40 as the cathode, the capacitance for a frequency, for example, of 120 Hz is found to be approximately 380 µF, indicating that the surface of dielectric oxide film 20 is adequately coated by polyaniline.

Also, when the power transmission characteristic S21 is measured by connecting the two pairs of electrode lead terminals, that is, the anode lead terminals 11 and 12 and cathode lead terminals 41 and 42 provided at both ends of the shielded strip line device to a network analyzer, S21 is found to be at most −70 dB in a frequency range of 100 kHz to 100 MHz and at most −40 dB at a frequency of 1 GHz. It can thus be understood that the shielded strip line device of the present embodiment has extremely excellent characteristics as a power decoupling device for high-speed digital circuits in comparison to prior-art capacitors.

A second embodiment of this invention shall now be described. In comparison to the arrangement of the shielded strip line device of the first embodiment described above, the arrangement of the shielded strip line device of the present embodiment differs in that a conductive polymer layer 31 is formed of polypyrrole. Besides this, the shielded strip line device of the present embodiment is the same in arrangement as the shielded strip line device of the first embodiment.

A method of manufacturing the shielded strip line device of the present embodiment shall now be described. First, by the same method as that of the first embodiment, a dielectric oxide film 20 and masks are formed on the surface of a valve metal plate 10. A methanol solution containing 10% by mass of ferric dodecylbenzenesulfonate is then prepared in a glass container. The abovementioned valve metal plate 10, with which dielectric oxide film 20 has been formed on the surface, is immersed in and then taken out from this solution. The valve metal plate is then dried for 30 minutes in air at room temperature. The valve metal plate is then immersed in and then taken out from an aqueous solution containing 50% by mass of pyrrole and then left in air for 30 minutes to polymerize the pyrrole. Thereafter, the valve metal plate is washed with water and ethanol and dried in an atmosphere of a temperature of 80° C. The operations from the immersion in the methanol solution to the drying at a temperature of 80° C. are repeated four times to form a conductive polymer layer, comprising polypyrrole having dodecylbenzenesulfonic acid as a dopant, on the surface of dielectric oxide film 20.

Then by the same method as that of the first embodiment described above, a conductive layer 30 is formed by forming a conductive carbon paste layer 32 and a silver paste layer 33 so as to surround the regions of the surface of valve metal plate 10 on which the conductive polymer layer has been formed, a metal plate 40, comprising a copper foil, is attached, and the respective end parts of metal plate 40 are arranged as cathode lead terminals 41 and 42. Thereafter, by the same method as that of the first embodiment, the masks are removed and anode lead terminals 11 and 12 are attached.

When the capacitance of the shielded strip line device of the present embodiment is measured using valve metal plate 10, comprising an aluminum foil, as the anode and metal plate 40, comprising a copper foil, as the cathode, the capacitance for a frequency, for example, of 120 Hz is found to be approximately 380 µF, indicating that the surface of dielectric oxide film 20 is adequately coated by polypyrrole.

Also, when the power transmission characteristic S21 is measured by connecting the two pairs of electrode lead terminals, that is, the anode lead terminals 11 and 12 and cathode lead terminals 41 and 42 provided at both ends of the shielded strip line device to a network analyzer, S21 is found to be at most −70 dB in a frequency range of 100 kHz to 100 MHz and at most −40 dB at a frequency of 1 GHz. It can thus be understood that the shielded strip line device of the present embodiment has extremely excellent characteristics as a power decoupling device for high-speed digital circuits in comparison to prior-art capacitors.

A third embodiment of this invention shall now be described. In comparison to the arrangement of the shielded strip line device of the first embodiment described above, the arrangement of the shielded strip line device of the present embodiment differs in that a conductive polymer layer 31 is formed of polyhexylthiophene. Besides this, the shielded strip line device of the present embodiment is the same in arrangement as the shielded strip line device of the first embodiment.

A method of manufacturing the shielded strip line device of the present embodiment shall now be described. First, by the same method as that of the first embodiment, a dielectric oxide film 20 and masks are formed on the surface of a valve metal plate 10. A xylene solution with a polyhexylthiophene concentration of 5% by mass is then prepared in a glass container, this solution is dripped onto the non-masked regions of the abovementioned valve metal plate 10, with which dielectric oxide film 20 and masks have been formed on the surface, and the valve metal plate is then dried in an atmosphere of a temperature of 80° C. The entire device is then immersed in an aqueous hydrochloric acid solution to form conductive polymer layer 31, comprising polyhexylthiophene having chlorine ion as a dopant, on the surface of dielectric oxide film 20.

Then by the same method as that of the first embodiment described above, a conductive layer 30 is formed by forming a conductive carbon paste layer 32 and a silver paste layer 33 so as to surround the regions of the surface of valve metal plate 10 on which the conductive polymer layer has been formed, a metal plate 40, comprising a copper foil, is attached, and the respective end parts of metal plate 40 are arranged as cathode lead terminals 41 and 42. Thereafter, the masks are removed and anode lead terminals 11 and 12 are attached.

When the capacitance of the shielded strip line device of the present embodiment is measured using valve metal plate 10, comprising an aluminum foil, as the anode and metal plate 40, comprising a copper foil, as the cathode, the capacitance for a frequency, for example, of 120 Hz is found to be approximately 380 µF, indicating that the surface of dielectric oxide film 20 is adequately coated by polyhexylthiophene.

Also, when the power transmission characteristic S21 is measured by connecting the two pairs of electrode lead terminals, that is, the anode lead terminals 11 and 12 and cathode lead terminals 41 and 42 provided at both ends of the shielded strip line device to a network analyzer, S21 is found to be at most −60 dB in a frequency range of 100 kHz to 100 MHz and at most −40 dB at a frequency of 1 GHz. It can thus be understood that the shielded strip line device of the present embodiment has extremely excellent characteristics as a power decoupling device for high-speed digital circuits in comparison to prior-art capacitors.

A fourth embodiment of this invention shall now be described. In comparison to the arrangement of the shielded strip line device of the first embodiment described above, the arrangement of the shielded strip line device of the present embodiment differs in that a conductive polymer layer 31 is formed of polyethylenedioxythiophene. Besides this, the shielded strip line device of the present embodiment is the same in arrangement as the shielded strip line device of the first embodiment.

A method of manufacturing the shielded strip line device of the present embodiment shall now be described. First, by the same method as that of the first embodiment, a dielectric oxide film 20 and masks are formed on the surface of a valve metal plate 10. An ethanol solution containing 10% by mass of ferric dodecylbenzenesulfonate is then prepared in a glass container. The abovementioned valve metal plate 10, with which dielectric oxide film 20 has been formed on the surface, is immersed in and then taken out from this solution and then dried for 30 minutes in air at room temperature. This sample is then immersed in and then taken out from an aqueous solution containing 50% by mass of ethylenedioxythiophene and then left in air for 30 minutes to polymerize the ethylenedioxythiophene. Thereafter, the sample is washed with water and ethanol and dried in an atmosphere of a temperature of 80° C. The operations from the immersion in the abovementioned ethanol solution to the drying at a temperature of 80° C. are repeated four times to form conductive polymer layer 31, comprising polyethylenedioxythiophene having dodecylbenzenesulfonic acid as a dopant, on the surface of dielectric oxide film 20.

Then by the same method as that of the first embodiment described above, a conductive layer 30 is formed by forming a conductive carbon paste layer 32 and a silver paste layer 33 so as to surround the regions of the surface of valve metal plate 10 on which the conductive polymer layer has been formed, a metal plate 40, comprising a copper foil, is attached, and the respective end parts of metal plate 40 are arranged as cathode lead terminals 41 and 42. Thereafter, by the same method as that of the first embodiment, the masks are removed and anode lead terminals 11 and 12 are attached.

When the capacitance of the shielded strip line device of the present embodiment is measured using valve metal plate 10, comprising an aluminum foil, as the anode and metal plate 40, comprising a copper foil, as the cathode, the capacitance for a frequency, for example, of 120 Hz is found to be approximately 380 $\mu$F, indicating that the surface of dielectric oxide film 20 is adequately coated by polyethylenedioxythiophene.

Also, when the power transmission characteristic S21 is measured by connecting the two pairs of electrode lead terminals, that is, the anode lead terminals 11 and 12 and cathode lead terminals 41 and 42 provided at both ends of the shielded strip line device to a network analyzer, S21 is found to be at most −60 dB in a frequency range of 1 MHz to 100 MHz and at most −40 dB at a frequency of 1 GHz. It can thus be understood that the shielded strip line device of the present embodiment has extremely excellent characteristics as a power decoupling device for high-speed digital circuits in comparison to prior-art capacitors.

A fifth embodiment of this invention shall now be described. The arrangement of the shielded strip line device of the present embodiment is the same as that of the shielded strip line device of the second embodiment described above. That is, a conductive polymer layer 31 is formed of polypyrrole.

A method of manufacturing the shielded strip line device of the present embodiment shall now be described. First, by the same method as that of the first embodiment, a dielectric oxide film 20 and masks are formed on the surface of a valve metal plate 10. A methanol solution containing 30% by mass of ferric dodecylbenzenesulfonate is then prepared in a glass container and cooled to a temperature of −50° C. Pyrrole is then dripped into this solution until its concentration becomes 6% by mass, and while maintaining the temperature of the solution at −50° C., the solution is stirred to mix the pyrrole. This solution is then dripped onto the non-masked regions of the abovementioned valve metal plate 10, with which dielectric oxide film 20 and masks have been formed on the surface, and the sample is then left at room temperature for 60 minutes. Thereafter, valve metal plate 10 is washed with water and ethanol and dried in an atmosphere of a temperature of 80° C. Conductive polymer layer 31, comprising polypyrrole having dodecylbenzenesulfonic acid as a dopant, is thereby formed on the surface of dielectric oxide film 20.

Then by the same method as that of the first embodiment described above, a conductive layer 30 is formed by forming a conductive carbon paste layer 32 and a silver paste layer 33 so as to surround the regions of the surface of valve metal plate 10 on which the conductive polymer layer has been formed, a metal plate 40, comprising a copper foil, is attached, and the respective end parts of metal plate 40 are arranged as cathode lead terminals 41 and 42. Thereafter, the masks are removed and anode lead terminals 11 and 12 are attached.

When the capacitance of the shielded strip line device of the present embodiment is measured using valve metal plate 10, comprising an aluminum foil, as the anode and metal plate 40, comprising a copper foil, as the cathode, the capacitance for a frequency for example of 120 Hz is found to be approximately 375 $\mu$F, indicating that the surface of dielectric oxide film 20 is adequately coated by polypyrrole.

Also, when the power transmission characteristic S21 is measured by connecting the two pairs of electrode lead terminals, that is, the anode lead terminals 11 and 12 and cathode lead terminals 41 and 42 provided at both ends of the shielded strip line device to a network analyzer, S21 is found to be at most −60 dB in a frequency range of 1 MHz to 100 MHz. It can thus be understood that the shielded strip line device of the present embodiment has extremely excellent characteristics as a power decoupling device for high-speed digital circuits in comparison to prior-art capacitors.

Figure 4:
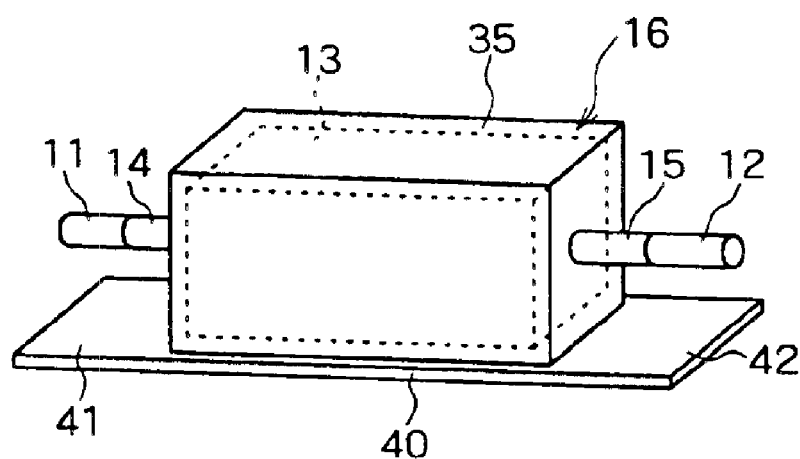
FIG. 4 is a perspective view, showing a shielded strip line device according to a sixth embodiment of this invention.

A sixth embodiment of this invention shall now be described. FIG. 4 is a perspective view, showing the shielded strip line device of this embodiment. As shown in FIG. 4, the shielded strip line device of this embodiment is provided with a formed body 13, comprising a sintered compact of tantalum powder with an average particle diameter, for example, of 0.5 $\mu$m. Formed body 13 has the shape of a rectangular parallelepiped and, for example, is 3 mm in width, 3 mm in length, and 1.8 mm in thickness. Tantalum wires 14 and 15 are connected to the respective ends of formed body. 13. Tantalum wires 14 and 15 are, for example, 0.3 mm in diameter. A metal member 16 is formed of formed body 13 and tantalum wires 14 and 15.

A dielectric oxide film (not shown) is formed on the surface of formed body 13, and on the surface of this dielectric oxide film, a conductive polymer layer, conductive carbon paste layer, and silver paste layer are formed, in the order starting from the inner side, so as to surround formed body 13 and the dielectric oxide film. A conductor layer 35 is formed of the conductive polymer layer, conductive carbon paste layer and silver paste layer. Anode lead terminals 11 and 12 are connected to tantalum wires 14 and 15, respectively.

A metal plate 40, comprising a copper foil of a thickness of, for example, approximately 100 μm, is overlapped onto the surface at one side of conductor layer 35. The length in the longitudinal direction of metal plate 40 is longer than the length in the longitudinal direction of conductor layer 35 and the respective end parts of metal plate 40 are thus not overlapped by conductor layer 35. These end parts are arranged respectively as cathode lead terminals 41 and 42.

A method of manufacturing the shielded strip line device of the present embodiment shall now be described. First, tantalum powder with an average particle diameter, for example, of 0.5 μm is filled in a container having an inner width, for example, of 3 mm, an inner length, for example, of 3 mm, and an inner thickness, for example, of 1.8 mm. Tantalum wires 14 and 15, each with a diameter, for example, of 0.3 mm, are then attached to the respective ends of this mass of tantalum powder, which is then press formed. The formed body is then heated in vacuum to a temperature of 200° C. to thereby prepare metal member 16, comprising formed body 13, which is a sintered compact of tantalum powder, and tantalum wires 14 and 15.

This metal member 16 is then subject to anodic oxidation treatment by application of a formation voltage, for example, of 10V in an aqueous phosphoric acid solution with a concentration, for example, of 0.05% by mass. Washing and drying are then performed and a dielectric oxide film (not shown), comprising a metal oxide film, is thereby formed on the surface of metal member 16. The parts of tantalum wires 14 and 15 of this metal member 16 are immersed in a solution of fluororesin, comprising hexafluoropropylene, and then dried to form masks (not shown) that cover tantalum wires 14 and 15. When this metal member 16 is subject to measurement of the electrostatic capacitance upon immersion in an aqueous sulfuric acid solution with a concentration of 0.1N, the electrostatic capacitance is found to be approximately 300 μF.

A methanol solution containing 10% by mass of ferric dodecylbenzenesulfonate is then prepared in a glass container. The metal member 16, with which dielectric oxide film 20 has been formed on the surface, is immersed in this solution and then taken out thereafter. Metal member 16 is then left and dried for 30 minutes in air at room temperature. Metal member 16 is then immersed in an aqueous solution containing 50% by mass of pyrrole, then taken but, and left in air for 30 minutes to polymerize the pyrrole. Thereafter, the sample is washed with water and ethanol and dried in an atmosphere of a temperature of 80° C. The operations from the immersion in the methanol solution to the drying at a temperature of 80° C. are repeated four times to form a conductive polymer layer (not shown), comprising polypyrrole having dodecylbenzenesulfonic acid as a dopant, on the surface of the dielectric oxide film.

A conductive carbon paste layer and silver paste layer are then formed so as to surround the regions of the surface of metal member 16 on which the conductive polymer layer has been formed. A conductor layer 35 is formed of the conductive polymer layer, conductive carbon paste layer, and silver paste layer. Thereafter, a metal plate 40, comprising a copper foil, is attached to the surface at one side of conductor layer 35. The length in the longitudinal direction of metal plate 40 is longer than the length in the same direction of conductor layer 35 and the respective end parts of metal plate 40 do not contact conductor layer 35. These end parts of metal plate 40 are used respectively as cathode lead terminals 41 and 42. Thereafter, the masks are removed and anode lead terminals 11 and 12 are attached to tantalum wires 14 and 15, respectively. The shielded strip line device of this embodiment is thus manufactured. With the shielded strip line device of this embodiment, a high-frequency signal current that is input from anode lead terminal 11 passes through metal member 16 and is output from anode lead terminal 12. In this process, the abovementioned signal current can be filtered by the dielectric oxide film and conductor layer 35. Since metal member 16 has the shape of a transmission line structure and the shape of the cross section orthogonal to the direction of flow of signal current is substantially fixed, the electromagnetic field inside metal member 16 will be uniform even when the signal current is a high-frequency current and the frequency dependence of the characteristic impedance will thus be small.

Also, since metal member 16 is formed of aluminum, which is a valve metal, a uniform and stable dielectric oxide film can be formed readily on the surface of metal member 16. Furthermore, since conductor layer 35 is provided so as to surround metal member 16, a shielded strip line is realized with which the magnetic flux that leaks from metal member 16 can be shielded and the impedance of the device can be made low. Furthermore, by the provision of metal plate 40, cathode lead terminals 41 and 42 can be formed and the impedance of the device can be made even lower. Yet furthermore, since conductor layer 35 is provided with the conductive polymer layer comprising polypyrrole, a conductor layer that is well adhered to the dielectric oxide film and high in conductivity can be formed readily.

Furthermore with the present embodiment, since formed body 13 is formed by a powder sintering method, formed body 13 can be processed readily into any shape. Also, the surface of formed body 13 can be increased without performing etching of the valve metal plate (see FIG. 2) as in the first through fifth embodiments described above. When the capacitance of the shielded strip line device of the present embodiment is measured using metal member 16 as the anode and metal plate 40, comprising a copper foil, as the cathode, the capacitance for a frequency, for example, of 120 Hz is found to be approximately 280 μF, indicating that the surface of dielectric oxide film is adequately coated by polypyrrole.

Also, when the power transmission characteristic S21 is measured by connecting the two pairs of electrode lead terminals, that is, the anode lead terminals 11 and 12 and cathode lead terminals 41 and 42 provided at both ends of the shielded strip line device to a network analyzer, S21 is found to be at most −60 dB in a frequency range of 100 kHz to 100 MHz and at most −40 dB at a frequency of 1 GHz. It can thus be understood that the shielded strip line device of the present embodiment has extremely excellent characteristics as a power decoupling device for high-speed digital circuits in comparison to prior-art capacitors.

Figure 5:
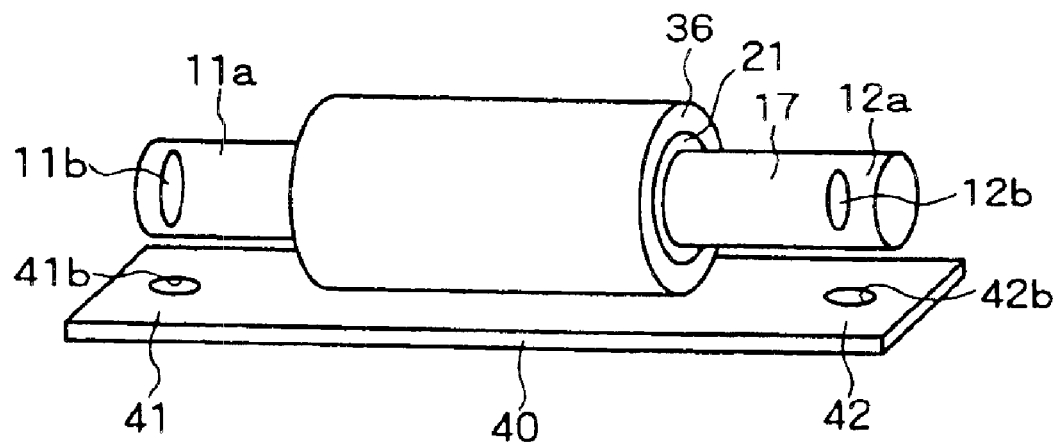
FIG. 5 is a perspective view, showing a shielded strip line device according to a seventh embodiment of this invention.

A seventh embodiment of this invention shall now be described. FIG. 5 is a perspective view, showing the shielded strip line device of this embodiment. As shown in FIG. 5, the shielded strip line device of this embodiment is provided with a cylindrical metal member 17, formed of aluminum and having a diameter of 5 mm and a length of 100 mm. The respective end parts of cylindrical metal member 17 are arranged as anode lead terminals 11a and 12a. Screw holes 11b and 12b are formed in anode lead terminals 11a and 12a, respectively.

A dielectric oxide film 21 is formed on the surface of cylindrical metal member 17, and on the outer side of dielectric oxide film 21, a conductive polymer layer, comprising polyaniline having para-toluenesulfonic acid as a dopant, a conductive carbon paste layer, and a silver paste layer are formed in that order starting from the inner side. A conductor layer 36 is formed of this conductive polymer layer, conductive carbon paste layer, and silver past layer. A metal plate 40, comprising a copper foil with a thickness, for example, of approximately 100 μm, is connected to conductor layer 36. The longitudinal direction of metal plate 40 coincides with the axial direction of cylindrical metal member 17. The length in the longitudinal direction of metal plate 40 is longer than the length in the same direction of conductor layer 36 and the respective end parts of metal plate 40 are thus not in contact with conductor layer 36. The respective end parts of this metal plate 40 are arranged as cathode lead terminals 41a and 42a. Screw holes 41b and 42b are formed in cathode lead terminals 41a and 42a, respectively.

A method of manufacturing the shielded strip line device of this embodiment shall now be described. First as cylindrical metal member 17, a cylinder, comprising aluminum and having a diameter of 5 mm and length of 100 mm, is prepared. The respective end parts of cylindrical metal member 17 are arranged as anode lead terminals 11a and 12a. Also, screw holes 11b and 12b are formed in anode lead terminals 11a and 12a, respectively. Cylindrical metal member 17 is then immersed in an aqueous ammonium borate solution with a concentration of 5% by mass and subject to anodic oxidation by applying a voltage of 10V. Washing and drying are then performed, and a dielectric oxide film 21, comprising a metal oxide film, is thus formed on the surface of cylindrical metal member 17. 10 mm parts at the respective ends of cylindrical metal member 17 are then immersed in a solution of fluororesin, comprising hexafluoropropylene, and then dried to form masks (not shown) at both ends of cylindrical metal member 17. An aqueous solution, containing 10% by mass of para-toluenesulfonic acid and 5% by mass of aniline, is then prepared in a glass container. The cylindrical metal member 17, on which the abovementioned dielectric oxide film 21 has been formed, is then immersed in and then taken out from this aqueous solution and then dried by leaving for 30 minutes in air at room temperature. The sample is then immersed in and then taken out from an aqueous solution, containing 10% by mass of ammonium peroxodisulfate and 10% by mass of para-toluenesulfonic acid and then left in air for 20 minutes to polymerize the aniline. Thereafter, the sample is washed with water and ethanol and dried in an atmosphere of a temperature of 80° C. These operations are repeated four times to form a conductive polymer layer, comprising polyaniline having para-toluenesulfonic acid as a dopant, on the surface of dielectric oxide film 21.

A conductive carbon paste layer and a silver paste layer are then formed so as to surround the regions of the surface of cylindrical metal member 17 on which the conductive polymer layer has been formed. A conductor layer 36 is thus formed of the conductive polymer layer, conductive carbon paste layer, and silver paste layer. Thereafter, a metal plate 40, comprising a copper foil with a thickness, for example, of approximately 100 μm, is connected to conductor layer 36. The respective end parts of this metal plate 40 are arranged as cathode lead terminals 41a and 42a. Screw holes 41b and 42b are then formed in cathode lead terminals 41a and 42a, respectively. Thereafter, the respective end parts of cylindrical metal member 17 are immersed in tetrahydrofuran to dissolve and eliminate the hexafluoropropylene, which is the mask resin. The shielded strip line device of this embodiment is thus manufactured.

With the shielded strip line device of this embodiment, a high-frequency signal current that is input from anode lead terminal 11a passes through cylindrical metal member 17 and is output from anode lead terminal 12a. In this process, the abovementioned signal current can be filtered by dielectric oxide film 21 and conductor layer 36. Since cylindrical metal member 17 has the shape of a transmission line structure and the shape of the cross section orthogonal to the direction of flow of signal current is substantially fixed, the electromagnetic field inside cylindrical metal member 17 will be uniform even when the signal current is a high-frequency current and the frequency dependence of the characteristic impedance will thus be small.

Also, since cylindrical metal member 17 is formed of aluminum, which is a valve metal, a uniform and stable dielectric oxide film can be formed readily on the surface of cylindrical metal member 17. Furthermore, since conductor layer 36 is provided so as to surround cylindrical metal member 17, a shielded strip line is realized with which the magnetic flux that leaks from cylindrical metal member 17 can be shielded and the impedance of the device can be made low. Furthermore, by the provision of metal plate 40, cathode lead terminals 41a and 42a can be formed and the impedance of the device can be made even lower. Yet furthermore, since conductor layer 36 is provided with the conductive polymer layer comprising polyaniline, a conductor layer that is well adhered to the dielectric oxide film and high in conductivity can be formed readily.

Furthermore with the present embodiment, since screw holes 11b, 12b, 41b, and 42b are formed respectively in anode lead terminals 11a and 12a and cathode lead terminals 41a and 42a, anode lead terminals 11a and 12a and cathode lead terminals 41a and 42a can be connected to external parts by means of screws. A large current can thus be made to flow with stability through the shielded strip line device.

When the capacitance of the shielded strip line device of the present embodiment is measured using cylindrical metal member 17 as the anode and metal plate 40, comprising a copper foil, as the cathode, the capacitance is found to be approximately 10 iF, indicating that the surface of the dielectric oxide film is adequately coated by polyaniline. Also, when the power transmission characteristic S21 is measured by connecting the two pairs of electrode lead terminals, that is, the screw holes 11a, 12a, 41a, and 42a provided at both ends of the shielded strip line device to a network analyzer, S21 is found to be at most −40 dB in a frequency range of 100 kHz to 1 GHz. It can thus be understood that the shielded strip line device of the present embodiment has extremely excellent characteristics as a power decoupling device for high-speed digital circuits in comparison to prior-art capacitors.

Figure 6:
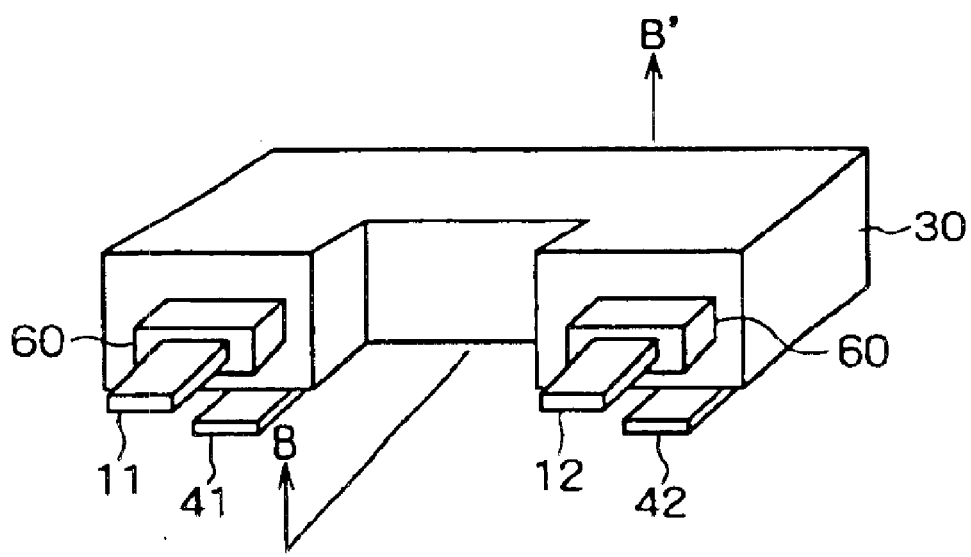
FIG. 6 is a perspective view, showing a shielded strip line device according to an eighth embodiment of this invention.

An eighth embodiment of this invention shall now be described. FIG. 6 is an external perspective view, showing the shielded strip line device of this eighth embodiment. The sectional view along line B–B' of FIG. 6 is the same as FIG. 3. The shielded strip line device of this embodiment is also equipped with a valve metal plate 10, having the shape of a long, thin, flat plate and having a dielectric oxide film 20 on its surface, and valve metal plate 10 is coated, via dielectric oxide film 20, by a layer 30 comprising a conductive substance.

Likewise with the present shielded strip line device, the parts at both ends in the longitudinal direction of valve metal plate 10 have substantially planar shapes that lie on the same straight line. Valve metal plate 10 is formed, for example, of aluminum. Valve metal plate 10 is rectangular in shape and, for example, 110 μm in thickness, 20 mm in length, and 10 mm in width. The surface of valve metal plate 10, that is, the top face, rear face, and end faces are increased by approximately 200 times in surface area by electrolytic etching in an electrolytic solution. The layer 30, comprising a conductive substance, is formed so as to cover the entire surface of valve metal plate 10 besides parts at both ends.

On planar view, the present shielded strip line has a U-like shape, with an anode lead terminal 11, which is connected to one end part of valve metal plate 10, being attached to one end part thereof and an anode lead terminal 12, which is electrically connected to the other end of valve metal plate 10, being attached to the other end part thereof. Between anode lead terminals 11 and 12 and layer 30, comprising a conductive substance, are provided insulating substances 60 that insulate these components from each other. Valve metal plate 10 is thus sealed by layer 30, comprising a conductive substance, and insulating substances 60. Each of anode lead terminals 11 and 12 has a flat, rectangular cross section.

Furthermore, a metal plate 40, with approximately the same dimensions as the bottom face of the shielded strip line device, is attached to the bottom face and cathode lead terminals 41 and 42 are attached to the respective end parts of metal plate 40.

A method of manufacturing the shielded strip line device shown in FIG. 6 shall now be described. As mentioned above, the sectional view along line B–B' of FIG. 6 is the same as the sectional view shown in FIG. 3.

With the present embodiment, an aluminum foil, with a thickness of 110 ìm and which has been increased by approximately 200 times in surface area by thickness, is used as valve metal plate 10. This aluminum foil is punched out to take on a square C-shape with a width of 10 mm. After providing the respective end parts of the aluminum foil (valve metal plate 10) with insulating substances 60, each of which is a fluororesin comprising hexafluoropropylene, this aluminum foil is subject to anodic oxidation at a voltage of 10V in a 5% by mass aqueous ammonium borate solution and then washed and dried to obtain an aluminum foil having a dielectric oxide film 20, comprising a metal oxide film. When the electrostatic capacitance of this foil is measured upon immersion in a 0.05 mole/liter aqueous sulfuric acid solution, the electrostatic capacitance is found to be approximately 380 μF.

An aqueous solution, with a para-toluenesulfonic acid concentration of 10% by mass and an aniline concentration of 5% by mass, is then prepared in a glass container, and the above-described aluminum foil, on which the above-mentioned dielectric oxide film 20 has been formed, is immersed in and then taken out from this aqueous solution. The foil is then dried for 30 minutes in air at room temperature, then immersed in and then taken out from an aqueous solution, containing 10% by mass of ammonium peroxodisulfate and 10% by mass of para-toluenesulfonic acid and then kept in air for another 20 minutes to polymerize the aniline. Thereafter, the sample is washed with water and ethanol and dried in an atmosphere of a temperature of 80° C. Upon repeating these operations four times, an aluminum foil (valve metal plate 10) is obtained with which the surface of dielectric oxide film 20 is covered with a conductive polymer layer 31. This conductive polymer layer 31 comprises polyaniline having para-toluenesulfonic acid as a dopant. Needless to say, conductive polymer layer 31 is prevented from forming at parts provided with insulating substances 60.

A conductive carbon paste layer 32 and a silver paste layer 33 are then coated so as to surround the parts of the aluminum foil on which conductive polymer layer 31 (polyaniline) has been formed, thereby completing a conductive layer 30. Metal plate 40, comprising a copper foil with a thickness of approximately 100 ìm, is then attached to conductive layer 30. The ends of metal plate 40 are arranged respectively as cathode lead terminals 41 and 42. Thereafter, the respective end parts of the aluminum foil (valve metal plate 10) are immersed in tetrahydrofuran to dissolve the resin comprising hexafluoropropylene, which is the mask resin, and an ultrasonic welder is used to attach two (a pair of) anode lead terminals 11 and 12 to the respective ends of the aluminum foil.

When the capacitance of the shielded strip line device thus obtained is measured using valve metal plate 10, which is the aluminum foil, as the anode and metal plate 40, comprising a copper foil, as the cathode, the capacitance for a measurement frequency, for example, of 120 Hz is found to be approximately 380 μF, indicating that the surface of dielectric oxide film 20 is adequately coated by polyaniline. Also, when the power transmission characteristic S21 is measured by connecting the two pairs of electrode lead terminals 11, 12, 41, and 42 provided at both ends of this shielded strip line device to a network analyzer, S21 is found to be at most −70 dB in a frequency range of 100 kHz to 100 MHz and at most −40 dB at a frequency of 1 GHz. It can thus be understood that the shielded strip line device of the present embodiment has extremely excellent characteristics as a power decoupling device for high-speed digital circuits in comparison to prior-art capacitors.

Figure 7:
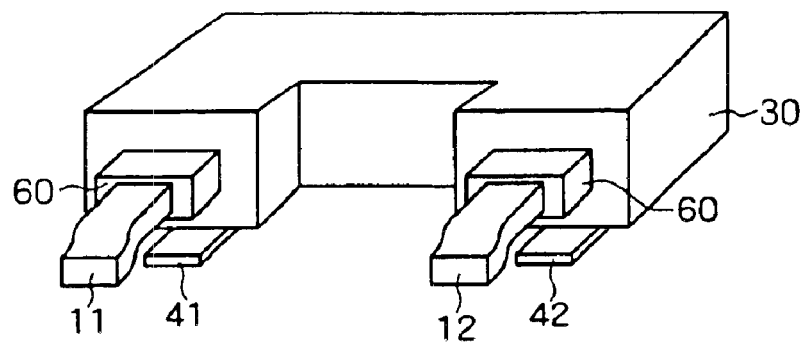
FIG. 7 is a perspective view, showing a shielded strip line device according to a ninth embodiment of this invention.

A ninth embodiment of this invention shall now be described with reference to FIG. 7. Though the shielded strip line device shown in FIG. 7 is the same as the shielded strip line device shown in FIG. 6, anode lead terminals 11 and 12 are bent and the cathode lead terminals 41 and 42 at the respective ends of metal plate 40 and the tips of anode lead terminals 11 and 12 are arranged to lie in the same plane to facilitate surface mounting onto a circuit board.

Figure 8:
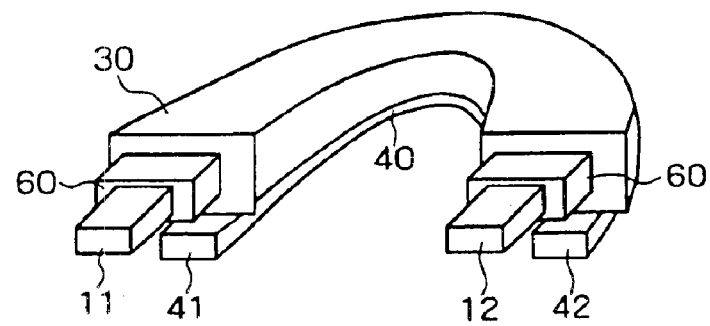
FIG. 8 is a perspective view, showing a shielded strip line device according to a tenth embodiment of this invention.
Figure 9:
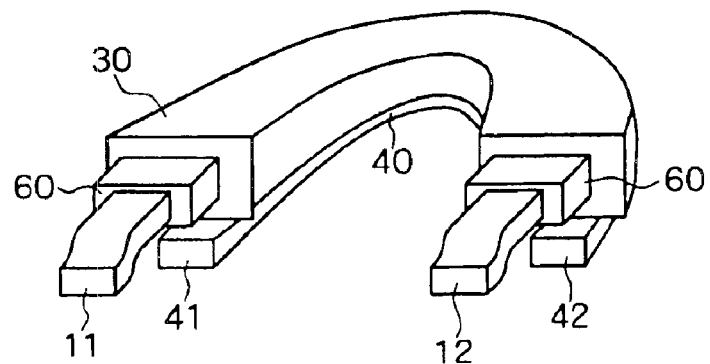
FIG. 9 is a perspective view, showing a shielded strip line device according to an eleventh embodiment of this invention.

A tenth embodiment of this invention shall now be described with reference to FIG. 8. Though the shielded strip line device shown in FIG. 8 is the same as the shielded strip line device shown in FIG. 6, whereas with the device shown in FIG. 6, the aluminum foil, which is the valve metal plate 10, is bent to a square C-shape and punched so as to have right-angle parts, the embodiment shown in FIG. 8 differs in that the aluminum foil is punched out to a U-shape that is curved to a more rounded shape. An eleventh embodiment of this invention shall now be described with reference to FIG. 9. Though the shielded strip line device shown in FIG. 9 is curved to a rounded shape as with the shielded strip line device shown in FIG. 8, anode lead terminals 11 and 12 are bent and the cathode lead terminals 41 and 42 at the respective ends of metal plate 40 and the tips of anode lead terminals 11 and 12 are arranged to lie in the same plane to facilitate surface mounting onto a circuit board.

Figure 10:
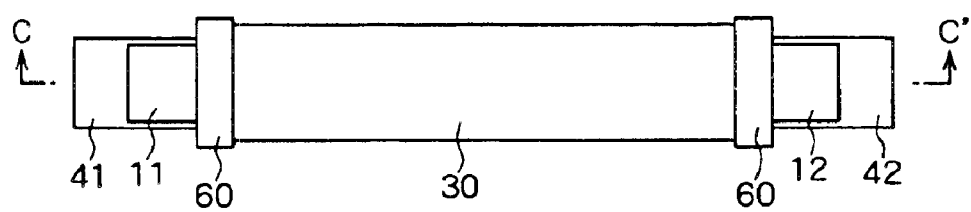
FIG. 10 is a plan view, showing a shielded strip line device according to a twelfth embodiment.
Figure 11:
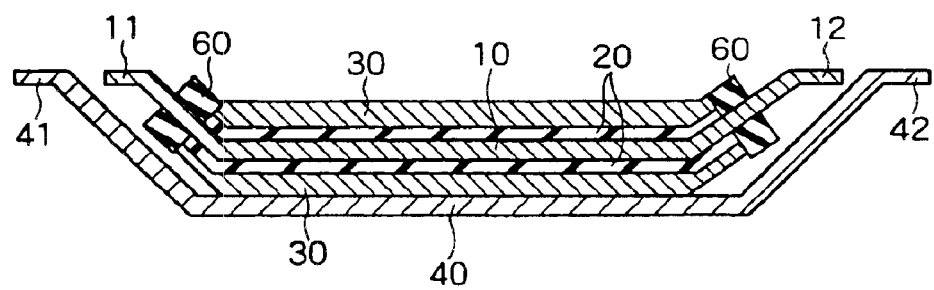
FIG. 11 is a sectional view along line C–C' of FIG. 10.

A twelfth embodiment of this invention shall now be described with reference to FIG. 10. FIG. 10 is a plan view, showing the shielded strip line device of this twelfth embodiment and FIG. 11 is a sectional view along line C–C' of FIG. 10.

Though this shielded strip line device has the same layer arrangement as the respective embodiments described above, in terms of shape, the present device is made so as to be dish-like in the cross-sectional shape in the longitudinal direction. That is, whereas with the ninth through eleventh embodiments, the aluminum foil, which is valve metal plate 10, is punched out to a shape that is curved or bent in a direction within the foil plane of the aluminum foil, with the present embodiment, a thin, strip-like aluminum foil is used as a valve metal plate 10 and the respective ends of the aluminum foil are bent in the same direction so as to be raised in a direction orthogonal to the foil plane of the aluminum foil. The respective ends of this aluminum foil, which is the valve metal plate 10, are arranged as anode lead terminals 11 and 12, a conductive layer 30 is formed so as to cover the dielectric oxide film 20 on the surface of valve metal plate 10, and a strip-like metal plate 40 is attached. The respective ends of metal plate 40 are arranged as cathode lead terminals 41 and 42. The tips of anode lead terminals 11 and 12 and the tips of cathode lead terminals 41 and 42 are arranged to lie in the same plane to facilitate surface mounting.

A thirteenth embodiment of this invention shall now be described. This thirteenth embodiment is an embodiment of a method of manufacturing the shielded strip line device shown in FIG. 6.

First, a methanol solution containing ferric dodecylbenzenesulfonate at a concentration of 10% by mass is prepared in a glass container. An aluminum foil, with which the processes up to the forming of dielectric oxide film 20 in the eighth embodiment have been completed, is then immersed in and then taken out from this solution. The aluminum foil is then dried for 30 minutes in air at room temperature, immersed in an aqueous solution containing 50% by mass of pyrrole, then taken out, and kept in air for another 30 minutes to polymerize the pyrrole. Thereafter, the aluminum foil is washed with water and ethanol and dried in an atmosphere of a temperature of 80° C. Upon repeating these operations four times, an aluminum foil (valve metal plate 10) is obtained with which the surface of dielectric oxide film 20 is covered with a conductive polymer layer 31. This conductive polymer layer 31 comprises polypyrrole having dodecylbenzenesulfonic acid as a dopant.

A conductive layer 30 is then formed by the same method as the eighth embodiment so as to surround the parts of the aluminum foil on which conductive polymer layer 31 (polypyrrole) has been formed. A metal plate 40, comprising a copper foil, is then attached and the respective ends of metal plate 40 are arranged as cathode lead terminals 41 and 42. Thereafter, by the method of the eighth embodiment, the mask resin is dissolved and two anode lead terminals 11 and 12 are attached.

When the capacitance of the shielded strip line device thus obtained is measured using valve metal plate 10, comprising an aluminum foil, as the anode and metal plate 40, comprising a copper foil, as the cathode, the capacitance for a frequency, for example, of 120 Hz is found to be approximately 380 $\mu$F, indicating that the surface of dielectric oxide film 20 is adequately coated by polypyrrole.

Also, when the power transmission characteristic S21 is measured by connecting the two pairs of electrode lead terminals 11, 12, 41, 42 provided at the respective ends of the shielded strip line device to a network analyzer, S21 is found to be at most –70 dB in a frequency range of 100 kHz to 100 MHz and at most –40 dB at a frequency of 1 GHz. It can thus be understood that the shielded strip line device of the present embodiment has much better characteristics as a power decoupling device for high-speed digital circuits in comparison to prior-art capacitors.

A fourteenth embodiment of this invention shall now be described. This fourteenth embodiment is an embodiment of a method of manufacturing the shielded strip line device shown in FIG. 6.

First, a xylene solution with a polyhexylthiophene concentration of 5% by mass is prepared in a glass container, and this solution is dripped onto the non-masked regions of an aluminum foil, with which the process up to the forming of dielectric oxide film 20 in the eighth embodiment have been completed, and the aluminum foil is then dried in an atmosphere of a temperature of 80° C. The entire device is then immersed in an aqueous hydrochloric acid solution to thereby coat the surface of dielectric oxide film 20 with a conductive polymer layer 31. This conductive polymer layer 31 comprises polyhexylthiophene having chlorine ion as a dopant.

A conductive layer 30 is then formed by the same method as the eighth embodiment so as to surround the parts of the aluminum foil on which conductive polymer layer 31 (polyhexylthiophene) has been formed. A metal plate 40, comprising a copper foil, is then attached and the respective ends of metal plate 40 are arranged as cathode lead terminals 41 and 42. Thereafter, by the method of the eighth embodiment, the mask resin is dissolved and two anode lead terminals 11 and 12 are attached.

When the capacitance of the shielded strip line device thus obtained is measured using valve metal plate 10, comprising an aluminum foil, as the anode and metal plate 40, comprising a copper foil, as the cathode, the capacitance for a frequency, for example of 120 Hz is found to be approximately 380 ìF, indicating that the surface of dielectric oxide film 20 is adequately coated by polyhexylthiophene.

Also, when the power transmission characteristic S21 is measured by connecting the two pairs of electrode lead terminals 11, 12, 41, 42 provided at the respective ends of the shielded strip line device to a network analyzer, S21 is found to be at most –60 dB in a frequency range of 100 kHz to 100 MHz and at most –40 dB at a frequency of 1 GHz. It can thus be understood that the shielded strip line device of the present embodiment has much better characteristics as a power decoupling device for high-speed digital circuits in comparison to prior-art capacitors.

A fifteenth embodiment of this invention shall now b described. This fifteenth embodiment is an embodiment of a method of manufacturing the shielded strip line device shown in FIG. 6.

First, an ethanol solution containing ferric dodecylbenzenesulfonate at a concentration of 10% by mass is prepared in a glass container. An aluminum foil, with which the processes up to the forming of dielectric oxide film 20 in the eighth embodiment have been completed, is then immersed in and then taken out from this solution. The aluminum foil is then dried for 30 minutes in air at room temperature, immersed in and then taken out from an aqueous solution containing 50% by mass of ethylenedioxythiophene and then kept in air for another 30 minutes to polymerize the ethylenedioxythiophene. Thereafter, the aluminum foil is washed with water and ethanol and dried in an atmosphere of a temperature of 80° C. Upon repeating these operations, for example, for four times, an aluminum foil (valve metal plate 10) is obtained with which the surface of dielectric oxide film 20 is covered with a conductive polymer layer 31. This conductive polymer layer 31 comprises polyethylenedioxythiophene having dodecylbenzenesulfonic acid as a dopant.

A conductive layer 30 is then formed by the same method as the first embodiment so as to surround the parts of the aluminum foil on which conductive polymer layer 31 (polyethylenedioxythiophene) has been formed. A metal plate 40, comprising a copper foil, is then attached and the respective ends of metal plate 40 are arranged as cathode lead terminals 41 and 42. Thereafter, by the method of the eighth embodiment, the mask resin is dissolved and two anode lead terminals 11 and 12 are attached.

When the capacitance of the shielded strip line device thus obtained is measured using valve metal plate 10, comprising an aluminum foil, as the anode and metal plate 40, comprising a copper foil, as the cathode, the capacitance for a frequency, for example, of 120 Hz is found to be approximately 380 μF, indicating that the surface of dielectric oxide film 20 is adequately coated by polyethylenedioxythiophene.

Also, when the power transmission characteristic S21 is measured by connecting the two pairs of electrode lead terminals 11, 12, 41, 42 provided at the respective ends of the shielded strip line device to a network analyzer, S21 is found to be at most −60 dB in a frequency range of 1 MHz to 100 MHz and at most −40 dB at a frequency of 1 GHz. It can thus be understood that the shielded strip line device of the present embodiment has much better characteristics as a power decoupling device for high-speed digital circuits in comparison to prior-art capacitors.

A sixteenth embodiment of this invention shall now be described. This sixteenth embodiment is an embodiment of a method of manufacturing the shielded strip line device shown in FIG. 6.

First, a methanol solution with a ferric dodecylbenzenesulfonate concentration of 30% by mass is prepared in a glass container and cooled to a temperature of −50° C. Pyrrole is then dripped into this solution until its concentration becomes 6% by mass and then mixed by stirring the solution while keeping the temperature at −50° C. This solution is then dripped onto the non-masked regions of an aluminum foil, with which the process up to the forming of dielectric oxide film 20 in the eighth embodiment have been completed, and the aluminum foil is then kept at room temperature for 60 minutes. By thereafter washing with water and ethanol and drying at 80° C., an aluminum foil is obtained with which the surface of dielectric oxide film 20 is covered with a conductive polymer layer 31. This conductive polymer layer 31 comprises polypyrrole having dodecylbenzenesulfonic acid as a dopant.

A conductive layer 30 is then formed by the same method as the eighth embodiment so as to surround the parts of the aluminum foil on which conductive polymer layer 31 (polypyrrole) has been formed. A metal plate 40, comprising a copper foil, is then attached and the respective ends of metal plate 40 are arranged as cathode lead terminals 41 and 42. Thereafter, by the method of the eighth embodiment, the mask resin is dissolved and two anode lead terminals 11 and 12 are attached.

When the capacitance of the shielded strip line device thus obtained is measured using valve metal plate 10, comprising an aluminum foil, as the anode and metal plate 40, comprising a copper foil, as the cathode, the capacitance for a frequency, for example, of 120 Hz is found to be approximately 375 μF, indicating that the surface of dielectric oxide film 20 is adequately coated by polypyrrole.

Also, when the power transmission characteristic S21 is measured by connecting the two pairs of electrode lead terminals 11, 12, 41, 42 provided at the respective ends of the shielded strip line device to a network analyzer, S21 is found to be at most −60 dB in a frequency range of 1 MHz to 100 MHz. It can thus be understood that the shielded strip line device of the present embodiment has much better characteristics as a power decoupling device for high-speed digital circuits in comparison to prior-art capacitors. A seventeenth embodiment of this invention shall now be described. FIGS. 12A through 12G are diagrams, showing, in the order of processes, a method of manufacturing the shielded strip line device shown in FIG. 6.

Figure 12A:
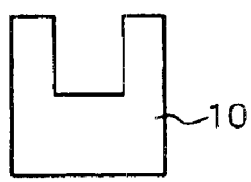
FIGS. 12A through 12G are diagrams, which show the manufacturing processes of a shielded strip line device according to a seventeenth embodiment of this invention in the order of the processes.
Figure 12B:
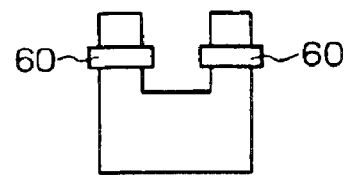

As shown in FIG. 12A, a valve metal plate 10, which is a square C-shaped metal foil, is prepared, and as shown in FIG. 12B, insulating substances 60 are provided near the respective ends of the metal foil that has been bent into a square C-shape. These insulating substances 60 prevent the creeping of solution in subsequent processes.

Figure 12C:
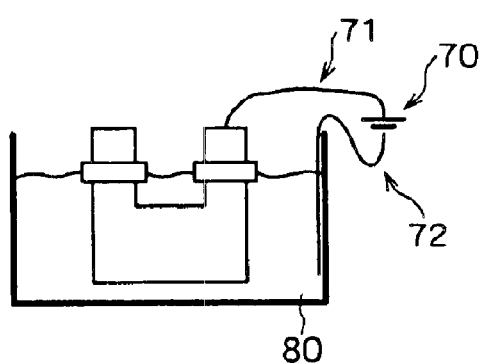
Figure 12D:
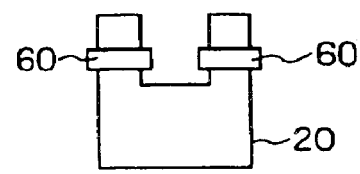

Next, as shown in FIG. 12C, a container, containing a 5% by mass aqueous ammonium borate solution 80, and a DC power supply 70 are prepared for the purpose of forming a dielectric oxide film 20 on the surface valve metal plate 10, and the cathode of DC power supply 70 is connected to the aqueous ammonium borate solution 80, the anode 71 is connected to valve metal plate 10, and a DC voltage is applied to perform anodic formation. In this process, parts of the valve metal plate 10 that lie below the position of insulating substances 60 in the Figure are made to be immersed in aqueous ammonium borate solution 80. As a result, dielectric oxide film 20 is formed on the surface of valve metal plate 10.

Figure 12E:
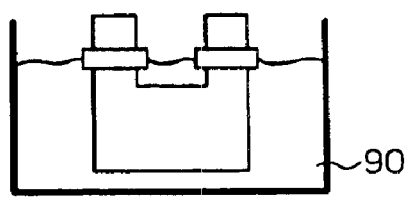
Figure 12F:
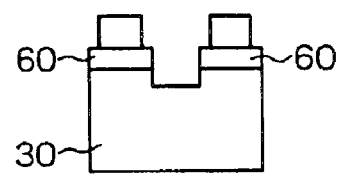
Figure 12G:
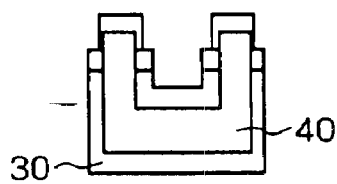

The valve metal plate 10, on which dielectric oxide film 20 has been formed in the above manner, is then immersed in a solution 90 for forming a conductive substance as shown in FIG. 12E. As a result, a conductive layer 30 is formed on the surface of dielectric oxide film 20 as shown in FIG. 12F. Lastly, a shielded strip line device is completed by attaching metal plate 40 to the surface of conductive substance 30 as shown in FIG. 12G.

As has been described above, by this invention, a shielded strip line device, which is low in impedance, especially in high-frequency ranges of 100 MHz or more, and is favorably adapted to high speed and high frequencies, mainly for use as a bypass device for a noise filter or as a decoupling device, can be obtained.

This invention thus provides the effect that a shielded strip line device, which is much better than prior-art capacitors as a power decoupling device for a high-speed digital circuit, can be obtained. Also by bending or curving the respective ends of a valve metal with a thin long shape in one direction to make the shape of the valve metal a square C-shape, a wedge-like shape, or a U-shape, the effect that a shielded strip line device can be manufactured simply by immersion in a solution for anodic formation or a solution for forming a layer of conductive material is provided.

What is claimed is:

1. A shielded strip line device comprising:
   a metal member formed of a valve metal through which high-frequency current flows and for which the cross-sectional shape orthogonal to the direction in which the high-frequency current flows is practically constant in said current direction;
   a dielectric oxide film, formed on the surface of said metal member; and
   a conductive layer, provided so as to sandwich the dielectric oxide layer and surround the cross-sectional shape of said metal member orthogonal to the direction in which the high-frequency current flows.

2. The shielded strip line device as set forth in claim 1, wherein said cross-sectional shape is rectangular.

3. The shielded strip line device as set forth in claim 1, wherein said cross-sectional shape is circular.

4. The shielded strip line device as set forth in claim 1, wherein said cross-sectional shape is annular.

5. The shielded strip line device as set forth in claim 1, having a pair of first electrode lead terminals provided at different positions of said valve metal member.

6. The shielded strip line device as set forth in claim 5, wherein said valve metal member has a cylindrical or columnar shape.

7. The shielded strip line device as set forth in claim 1, wherein said conductive layer includes a layer of a conductive polymer.

8. The shielded strip line device as set forth in claim 7, wherein said conductive polymer is one or more compounds selected from the group consisting of polypyrrole, polythiophene, and polyaniline or is a derivative of an abovementioned compound or compounds.

9. The shielded strip line device as set forth in claim 1, wherein said valve metal selected from the group consisting of aluminum, tantalum, and niobium.

10. The shielded strip line device as set forth in claim 1, having:

a pair of first electrode lead terminals provided at different positions of said valve metal member;

a metal plate affixed to said conductive paste layer; and a pair of second electrode lead terminals disposed on said metal plate in correspondence to said pair of first electrode lead terminals.

* * * * *